(12) United States Patent
Matsumoto et al.

(10) Patent No.: US 9,960,126 B2
(45) Date of Patent: May 1, 2018

(54) SEMICONDUCTOR DEVICE

(71) Applicant: Mitsubishi Electric Corporation, Tokyo (JP)

(72) Inventors: Manabu Matsumoto, Tokyo (JP); Yoshitaka Otsubo, Tokyo (JP); Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/430,594

(22) Filed: Feb. 13, 2017

(65) Prior Publication Data

US 2018/0025993 A1 Jan. 25, 2018

(30) Foreign Application Priority Data

Jul. 19, 2016 (JP) .................... 2016-141550

(51) Int. Cl.
*H01L 23/40* (2006.01)
*H01L 23/00* (2006.01)
*H01L 23/367* (2006.01)
*H01L 23/31* (2006.01)

(52) U.S. Cl.
CPC ........ *H01L 23/562* (2013.01); *H01L 23/3114* (2013.01); *H01L 23/367* (2013.01); *H01L 24/29* (2013.01); *H01L 24/32* (2013.01); *H01L 2224/29639* (2013.01); *H01L 2224/32245* (2013.01); *H01L 2924/1033* (2013.01); *H01L 2924/10254* (2013.01); *H01L 2924/10272* (2013.01); *H01L 2924/13055* (2013.01)

(58) Field of Classification Search
None
See application file for complete search history.

(56) References Cited

U.S. PATENT DOCUMENTS

2005/0280124 A1* 12/2005 Coyle ................. H01L 23/4334
257/666

FOREIGN PATENT DOCUMENTS

JP 2014-216459 A 11/2014

* cited by examiner

*Primary Examiner* — Reema Patel
(74) *Attorney, Agent, or Firm* — Studebaker & Brackett PC

(57) ABSTRACT

According to the present invention, a semiconductor device includes a heat spreader, a semiconductor chip fixed to a mounting surface of the heat spreader via a bonding member and sealing resin that covers the heat spreader and the semiconductor chip, wherein a groove is formed on the mounting surface around the semiconductor chip, a length between the semiconductor chip and the groove is equal to or greater than a depth of the groove, and the bonding member is not provided on at least part of a region of the mounting surface between the semiconductor chip and the groove.

7 Claims, 3 Drawing Sheets

SEMICONDUCTOR DEVICE

BACKGROUND OF THE INVENTION

Field

The present invention relates to a semiconductor device used for a power electronics apparatus, for example.

Background

JP 2014-216459 A discloses a structure in which a semiconductor chip is disposed on a thermal diffusion plate to diffuse heat generated from the semiconductor chip. The semiconductor chip is fixed to the thermal diffusion plate using a bonding member. The semiconductor chip and the thermal diffusion plate are sealed using sealing resin. A groove is formed on a perimeter of a region of the thermal diffusion plate in which the semiconductor chip is mounted. The groove allows thermal stress generated at an interface between the semiconductor chip and the sealing resin to be reduced.

In the semiconductor device disclosed in JP 2014-216459 A, the bonding member such as solder wets and spreads up to an end of the groove. Here, the bonding member has poor adhesiveness with respect to the sealing resin. Therefore, the sealing resin is easy to peel off from the bonding member. In order to prevent peeling of the sealing resin, JP 2014-216459 A provides the groove in the vicinity of the semiconductor chip. This reduces the area of contact between the wetting and spreading bonding member and the sealing resin, and prevents the peeling of the sealing resin. Here, if the groove is disposed in the vicinity of the semiconductor chip, the groove may obstruct thermal diffusion from the semiconductor chip. On the other hand, if the groove is made shallower so as to reduce influences on thermal diffusion, thermal stress applied to the sealing resin cannot be sufficiently reduced.

SUMMARY

The present invention has been implemented to solve the aforementioned problems and it is an object of the present invention to provide a semiconductor device that can reduce thermal stress applied to sealing resin without obstructing thermal diffusion from a semiconductor chip.

The features and advantages of the present invention may be summarized as follows.

According to the present invention, a semiconductor device includes a heat spreader, a semiconductor chip fixed to a mounting surface of the heat spreader via a bonding member and sealing resin that covers the heat spreader and the semiconductor chip, wherein a groove is formed on the mounting surface around the semiconductor chip, a length between the semiconductor chip and the groove is equal to or greater than a depth of the groove, and the bonding member is not provided on at least part of a region of the mounting surface between the semiconductor chip and the groove.

Other and further objects, features and advantages of the invention will appear more fully from the following description.

DESCRIPTION OF EMBODIMENTS

Figure 1:
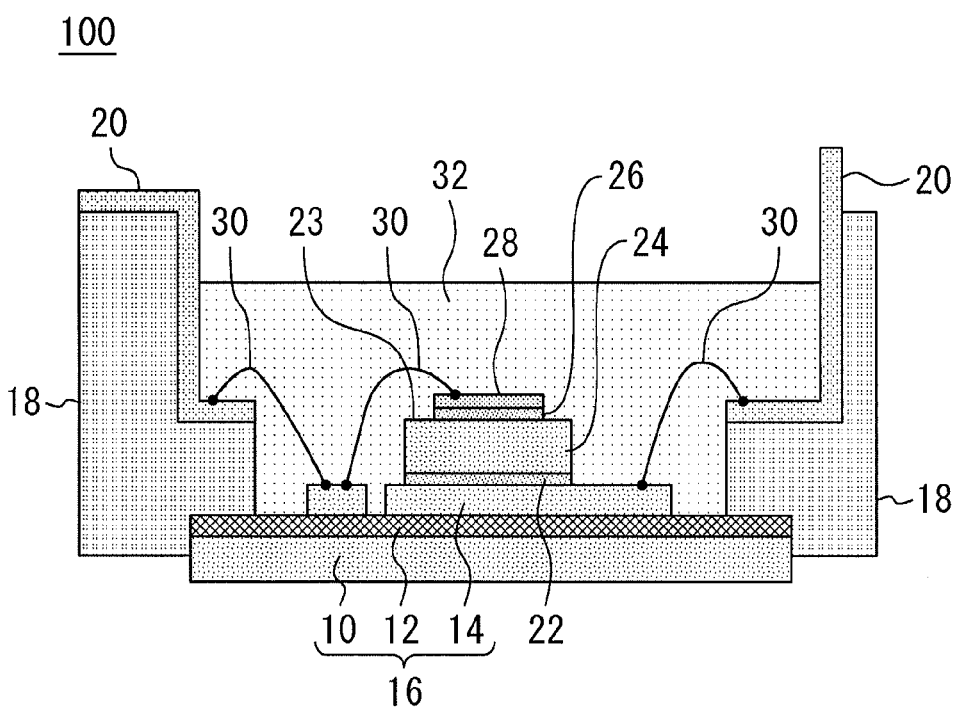
FIGS. 1-4 are cross-sectional views of a semiconductor device according to a first embodiment.

A semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a cross-sectional view of a semiconductor device according to a first embodiment. A semiconductor device 100 according to the present embodiment is provided with a metal base 10. An insulating sheet 12 is provided on the metal base 10. The insulating sheet 12 is formed of resin. A metal pattern 14 is provided on the insulating sheet 12. The metal base 10, the insulating sheet 12 and the metal pattern 14 constitute a base plate 16. The metal base 10 is insulated from the metal pattern 14 by the insulating sheet 12.

A case 18 is provided on the insulating sheet 12. The case 18 is disposed on a perimeter of the insulating sheet 12 so as to surround the metal pattern 14. A terminal 20 is provided on the case 18. A heat spreader 24 is fixed onto the metal pattern 14 via solder 22. The heat spreader 24 is made of Mo or Cu as a material. A semiconductor chip 28 is fixed onto a mounting surface 23 of the heat spreader 24 via a bonding member 26. The semiconductor chip 28 is, for example, an IGBT (insulated gate bipolar transistor). The heat spreader 24 is provided so as to efficiently dissipate heat from the semiconductor chip 28. In the present embodiment, the bonding member 26 is solder.

The semiconductor chip 28 and the metal pattern 14 are connected via a wire 30. The metal pattern 14 and the terminal 20 are connected via the wire 30. A region surrounded by the case 18 is sealed with sealing resin 32. Therefore, the heat spreader 24 and the semiconductor chip 28 are covered with the sealing resin 32. In the present embodiment, the sealing resin 32 is epoxy resin.

Figure 2:
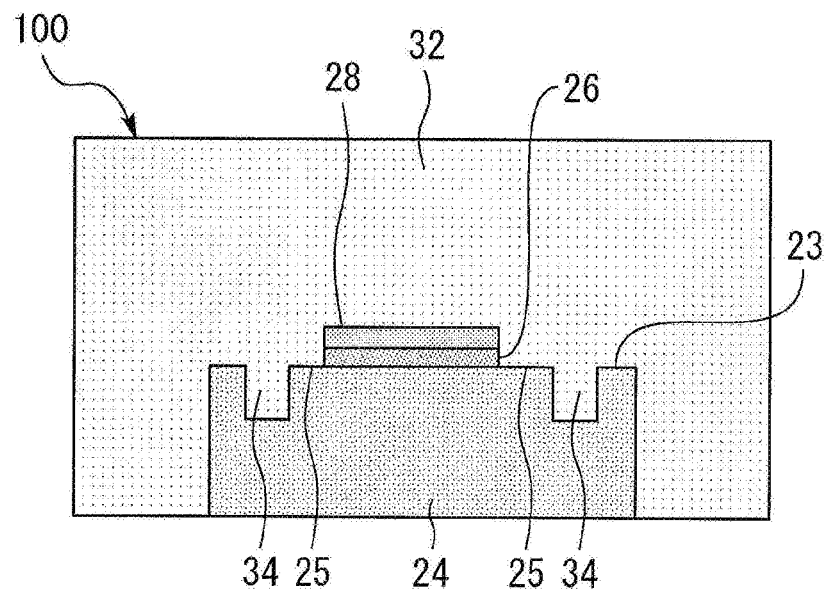

FIG. 2 is a cross-sectional view of the semiconductor device according to the first embodiment. FIG. 2 is an enlarged view of a periphery of the heat spreader 24 in FIG. 1. A groove 34 is formed around the semiconductor chip 28 in the mounting surface 23 of the heat spreader 24. The groove 34 is formed so as to surround the semiconductor chip 28. The sealing resin 32 is provided so as to fill the groove 34.

Figure 3:
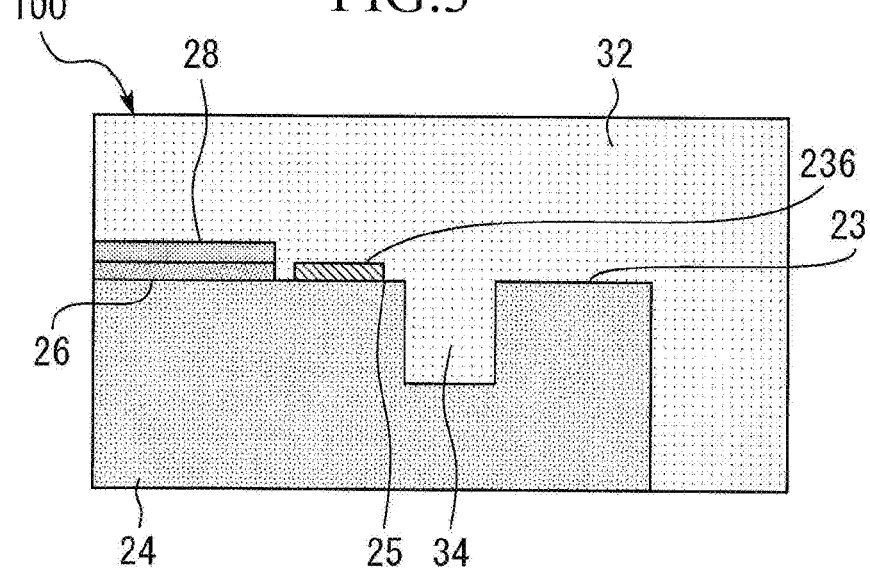

FIG. 3 is a cross-sectional view of the semiconductor device according to the first embodiment. FIG. 3 is an enlarged view of the vicinity of the groove 34 in FIG. 2. The semiconductor device 100 is provided with a solder resist 236 in a region 25 of the mounting surface 23 between the semiconductor chip 28 and the groove 34. For this reason, the bonding member 26 is not spread toward the groove 34 side beyond the solder resist 236. Therefore, in the present embodiment, the bonding member 26 is not provided on the region of the mounting surface 23 between the solder resist 236 and the groove 34.

Figure 4:
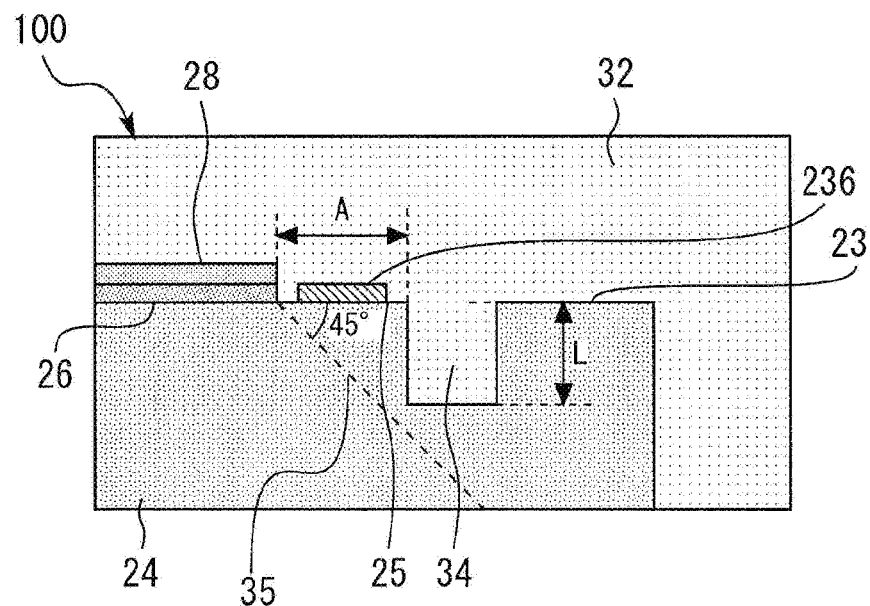

FIG. 4 is a cross-sectional view of the semiconductor device according to the first embodiment. In the present embodiment, a length A between the semiconductor chip 28 and the groove 34 is equal to or greater than a depth L of the groove 34. Here, the length A is a distance on the mounting surface 23 from an end of the semiconductor chip 28 adjacent to the groove 34 to an end of the groove 34 adjacent to the semiconductor chip 28. The length A is also a width of the region 25. At this time, the groove 34 is not formed below a virtual line 35 inclined at an angle of 45 degrees with respect to the mounting surface 23 toward a bottom surface of the heat spreader 24.

Generally, when a semiconductor chip is sealed with sealing resin, due to a difference in a coefficient of linear expansion between the semiconductor chip and the sealing resin, thermal stress caused by a thermal stress force applies to the sealing resin. The thermal stress may possibly cause the sealing resin to peel off from the semiconductor chip. Cracks may also occur in the sealing resin. In the present embodiment, the heat spreader 24 is provided with the groove 34. The groove 34 is filled with the sealing resin 32. Therefore, the sealing resin 32 filling the groove 34 functions as an anchor and can keep the sealing resin 32 tightly adhered to the heat spreader 24.

When the sealing resin 32 tightly adheres to the heat spreader 24, the semiconductor chip 28 also tightly adheres to the sealing resin 32. For this reason, thermal stress applied to the sealing resin 32 in the portion of contact between the semiconductor chip 28 and the sealing resin 32 can be relaxed. Especially, thermal stress generated in the vicinity of the end of the semiconductor chip 28 adjacent to the groove 34 is more likely to be relaxed. Therefore, it is possible to prevent the sealing resin 32 from peeling off from the semiconductor chip 28. It is also possible to prevent cracks from occurring in the sealing resin 32.

Furthermore, when the sealing resin 32 tightly adheres to the heat spreader 24, thermal stress is relaxed at a joint between the semiconductor chip 28 and the bonding member 26 and at a joint between the bonding member 26 and the heat spreader 24. Therefore, it is possible to prevent cracks from occurring on the bonding member 26.

Here, when the groove is provided in the heat spreader, thermal diffusion of the semiconductor chip may be obstructed. The heat value is particularly large in a semiconductor device whose rated current value is equal to or greater than 100 A. For this reason, limiting thermal diffusion by the groove may become a problem. In contrast, in the present embodiment, the length A between the semiconductor chip 28 and the groove 34 is equal to or greater than the depth L of the groove 34. That is, in the present embodiment, there is no groove 34 within a range of less than 45 degrees from right below the semiconductor chip 28. This structure can prevent the groove 34 from obstructing thermal diffusion from the semiconductor chip 28 to the heat spreader 24.

Furthermore, when the semiconductor chip is bonded to the heat spreader using solder, the solder may wet and spread over a region between the semiconductor chip and the groove. At this time, the solder comes into contact with the sealing resin in the region between the semiconductor chip and the groove. Adhesion between the solder and the sealing resin is generally weak. Therefore, sealing resin is likely to peel off in the contact region between the solder and the sealing resin. As a method of preventing peeling of the sealing resin, the area of contact between the sealing resin and the solder may be reduced. One such method may be to shorten the distance between the semiconductor chip and the groove.

Here, as described above, to prevent the limitation of thermal diffusion by the groove 34, the length A between the semiconductor chip 28 and the groove 34, and the depth L of the groove 34 need to satisfy A L. For this reason, in order to shorten the distance between the semiconductor chip 28 and the groove 34 while preventing the limitation of thermal diffusion by the groove 34, it is necessary to make the groove 34 shallow. Here, the deeper the groove 34, the higher the effect of relaxing thermal stress applied to the sealing resin 32 becomes. Therefore, when the groove 34 is made shallower, it may be impossible to sufficiently relax thermal stress.

In contrast, in the present embodiment, the solder resist 236 is provided in the region 25 of the mounting surface 23 between the semiconductor chip 28 and the groove 34. Thus, at least part of the region 25 becomes a region where the bonding member 26 is not provided. The region where the bonding member 26 wets and spreads is limited to only the region between the solder resist 236 and the semiconductor chip 28. Therefore, the area of contact between the sealing resin 32 and the bonding member 26 can be reduced compared to the case where the bonding member 26 wets and spreads over the entire region 25. Therefore, even when the length A between the semiconductor chip 28 and the groove 34 is large, it is possible to prevent the sealing resin 32 from peeling off from the bonding member 26.

As described so far, the present embodiment can increase the length A between the semiconductor chip 28 and the groove 34 while preventing the sealing resin 32 from peeling off from the bonding member 26. By setting the length A to a large value, it is possible to deepen the groove 34 without obstructing thermal diffusion from the semiconductor chip 28. Deepening the groove 34 allows thermal stress applied to the sealing resin 32 to be sufficiently relaxed. Therefore, it is possible to prevent peeling of the sealing resin 32 and generation of cracks in the sealing resin 32.

As described above, the semiconductor device 100 according to the present embodiment can sufficiently reduce thermal stress applied to the sealing resin 32 without obstructing thermal diffusion from the semiconductor chip 28. Therefore, it is possible to obtain the semiconductor device 100 with high reliability. In order to achieve a sufficient effect of reducing thermal stress, the depth L of the groove 34 needs to be 0.3 mm or greater. Therefore, in the present embodiment, the length A is set to 0.3 mm or greater. Furthermore, when the length A between the semiconductor chip 28 and the groove 34 is small, positioning of the semiconductor chip 28 becomes difficult when it is mounted. In consideration of positioning accuracy when the semiconductor chip 28 is mounted, the length A is preferably set to 0.3 mm or greater.

As a modification of the present embodiment, the bonding member 26 may be anything other than solder. For example, the bonding member 26 may be a material containing silver such as a silver paste. In this case, the semiconductor chip 28 is fixed to the heat spreader 24 through Ag bonding. When the bonding member 26 is a silver paste, the bonding member 26 has lower wettability than solder. Therefore, the range of the region 25 in which the bonding member 26 wets and spreads becomes smaller than when solder is used. Therefore, the area of contact between the bonding member 26 and the sealing resin 32 can be reduced without providing the solder resist 236.

In the present embodiment, the range in which the bonding member 26 wets and spreads is limited to part of the region 25 using the solder resist 236. In contrast, the bonding member 26 wetting and spreading over the region 25 may be removed after bonding the semiconductor chip 28 to the heat spreader 24. In this case, the region covered with the bonding member 26 of the region 25 can be reduced without providing the solder resist 236.

Furthermore, in the region 25 in FIG. 3, the solder resist 236 is disposed with a certain gap from the semiconductor chip 28. In this case, the region between the solder resist 236 and the semiconductor chip 28 becomes a region in which the bonding member 26 wets and spreads. In contrast, the solder resist 236 may be provided so as to come into contact with the semiconductor chip 28. In this case, the bonding member 26 is disposed only below the semiconductor chip 28. Therefore, the entire region 25 becomes a region in which the bonding member 26 is not provided.

Furthermore, the groove 34 in the present embodiment is assumed to be formed so as to surround the semiconductor chip 28. In contrast, the groove 34 may be formed in plurality, one on each of both sides of the semiconductor chip 28. Furthermore, the groove 34 may be formed in a double structure surrounding the semiconductor chip 28. The width of the groove 34 is fixed in the present embodiment. Furthermore, the bottom part of the groove 34 is flat and parallel to the bottom surface of the heat spreader 24. Here, the shape of the groove 34 may be any shape other than this shape. For example, the cross-sectional shape of the groove 34 may be U-shaped or V-shaped.

Figure 5:
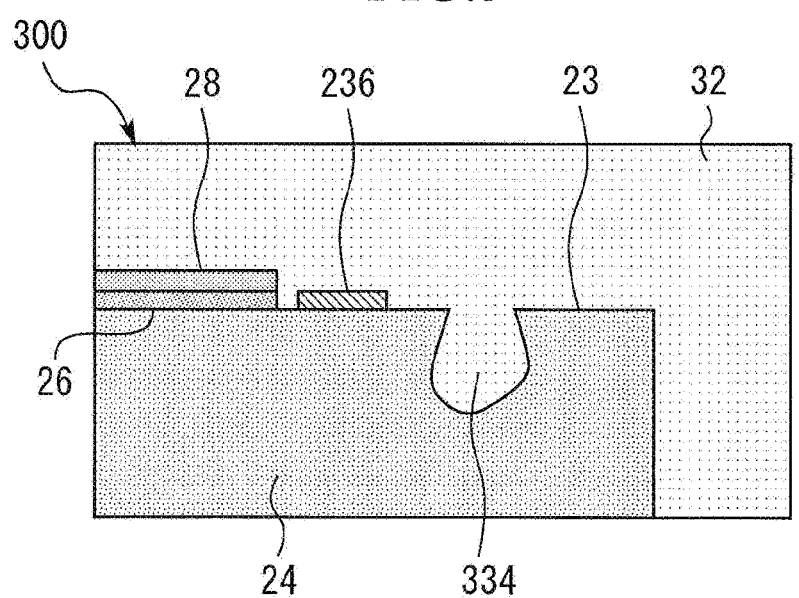
FIG. 5 is a cross-sectional view of a semiconductor device according to a modification of the first embodiment.

FIG. 5 is a cross-sectional view of a semiconductor device according to a modification of the first embodiment. A semiconductor device 300 according to the modification is provided with a groove 334. The shorter the distance from the mounting surface 23, the smaller the width of the groove 334 becomes. The groove 334 is filled with sealing resin 32.

Since the sealing resin 32 filling the groove 334 becomes an anchor, the sealing resin 32 tightly adheres to the heat spreader 24. The groove 334 is shaped like an octopus trap that the shorter the distance from the mounting surface 23, the smaller the width of the groove 334 becomes. For this reason, compared to the case where the width of the groove 334 is fixed, the sealing resin 32 tightly adheres to the heat spreader 24 in the groove 334. Therefore, the sealing resin 32 is fixed more firmly to the heat spreader 24 compared to the semiconductor device 100. Thus, it is possible to further suppress thermal stress applied to the sealing resin 32 compared to the semiconductor device 100.

Furthermore, the semiconductor chip 28 may also be formed of a wideband gap semiconductor. As the wideband gap semiconductor, silicon carbide, a nitride gallium-based material or diamond can be used. A semiconductor device using a wide gap semiconductor may be required to operate under a high temperature condition. Here, the semiconductor device 100 according to the present embodiment can be configured so that thermal diffusion from the semiconductor chip 28 is not limited by the groove 34. Furthermore, the depth of the groove 34 can be increased so as to sufficiently reduce thermal stress. Therefore, the semiconductor chip 28 can be operated under a high temperature condition. Note that the technical features described in the present embodiment may be used in combination as appropriate.

In the semiconductor device according to the present invention, the length between the semiconductor chip and the groove is equal to or greater than the depth of the groove. It is thereby possible to prevent the groove from obstructing thermal diffusion. In the region of the mounting surface between the semiconductor chip and the groove, the region where the bonding member wets and spreads is limited. For this reason, the area of contact between the bonding member and the sealing resin is limited, and it is possible to prevent peeling of the sealing resin. Therefore, the length between the semiconductor chip and the groove can be increased. It is thereby possible to deepen the groove without limiting thermal diffusion of the semiconductor chip. Therefore, it is possible to sufficiently reduce thermal stress without limiting thermal diffusion of the semiconductor chip.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-141550, filed on Jul. 19, 2016 including specification, claims, drawings and summary, on which the Convention priority of the present application is based, are incorporated herein by reference in its entirety.

The invention claimed is:

1. A semiconductor device comprising:
   a heat spreader;
   a semiconductor chip fixed to a mounting surface of the heat spreader via a bonding member; and
   sealing resin that covers the heat spreader and the semiconductor chip,
   wherein a groove is formed on the mounting surface around the semiconductor chip,
   a length between the semiconductor chip and the groove is equal to or greater than a depth of the groove,
   the bonding member is not provided on at least part of a region of the mounting surface between the semiconductor chip and the groove, and
   a solder resist is provided on the mounting surface between the semiconductor chip and the groove.

2. The semiconductor device according to claim 1, wherein the bonding member contains silver.

3. The semiconductor device according to claim 1, wherein the length between the semiconductor chip and the groove is equal to or greater than 0.3 mm.

4. The semiconductor device according to claim 1, wherein a cross section of the groove has a reverse tapered shape.

5. The semiconductor device according to claim 1, wherein the semiconductor chip is formed of a wideband gap semiconductor.

6. The semiconductor device according to claim 5, wherein the wideband gap semiconductor is made of silicon carbide, a nitride gallium-based material or diamond.

7. The semiconductor device according to claim 1, wherein as the distance between the groove and the mounting surface decreases, the width of the groove decreases.

* * * * *